(12) United States Patent
Korinsky et al.

(10) Patent No.: US 6,940,716 B1
(45) Date of Patent: Sep. 6, 2005

(54) METHOD AND APPARATUS FOR DISSIPATING HEAT FROM AN ELECTRONIC DEVICE

(75) Inventors: George K. Korinsky, Portland, OR (US); Craig Crawford, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/615,922

(22) Filed: Jul. 13, 2000

(51) Int. Cl.[7] .............................................. H05K 7/20
(52) U.S. Cl. ..................... 361/695; 165/80.3; 165/121; 361/697; 361/715; 361/687; 454/184
(58) Field of Search ...................... 62/259.2; 165/80.3, 165/121–122; 174/15.1, 16.1, 16.3; 312/223.1; 361/688–697, 704, 707, 715, 717–720; 454/184

(56) References Cited

U.S. PATENT DOCUMENTS

| | | | | |
|---|---|---|---|---|
| 5,422,787 A | * | 6/1995 | Gourdine | 361/697 |
| 5,497,825 A | * | 3/1996 | Yu | 165/80.3 |
| 5,563,768 A | * | 10/1996 | Perdue | 361/695 |
| 5,691,883 A | | 11/1997 | Nelson | 361/697 |
| 5,912,802 A | | 6/1999 | Nelson | 361/695 |
| 5,926,367 A | | 7/1999 | Gutierrez et al. | 361/695 |
| 5,933,324 A | | 8/1999 | Barrett | 361/703 |
| 5,936,836 A | * | 8/1999 | Schoider | 361/695 |
| 6,021,042 A | | 2/2000 | Anderson et al. | 361/695 |
| 6,064,571 A | | 5/2000 | Noble | 361/695 |
| 6,125,924 A | * | 10/2000 | Lin | 165/122 |
| 6,145,586 A | * | 11/2000 | Lo | 165/80.3 |
| 6,148,907 A | * | 11/2000 | Cheng | 165/121 |
| 6,304,445 B1 | * | 10/2001 | Bollesen | 361/697 |

* cited by examiner

*Primary Examiner*—Gregory Thompson
(74) *Attorney, Agent, or Firm*—Schwegman, Lundberg, Woessner & Kluth, P.A.

(57) ABSTRACT

A method and apparatus for dissipating heat from an electronic device is described. The method and apparatus provides a scalable, cost effective, highly efficient, universally applied thermal solution for high heat generating electronic components. In one embodiment, a housing attaches over a heat sink for an electronic device. Various cooling attachments can be attached to this housing to provide a multitude of air flow enhancers. The cooling attachments are designed to provide a thermal engineer or a system integrator with several options for cooling an electronic component. The cooling attachments can be placed in multiple configurations to provide unique thermal solutions. In another embodiment, a kit of parts for a cooling system is provided. The kit of parts includes a housing and a variety of cooling attachments.

21 Claims, 14 Drawing Sheets

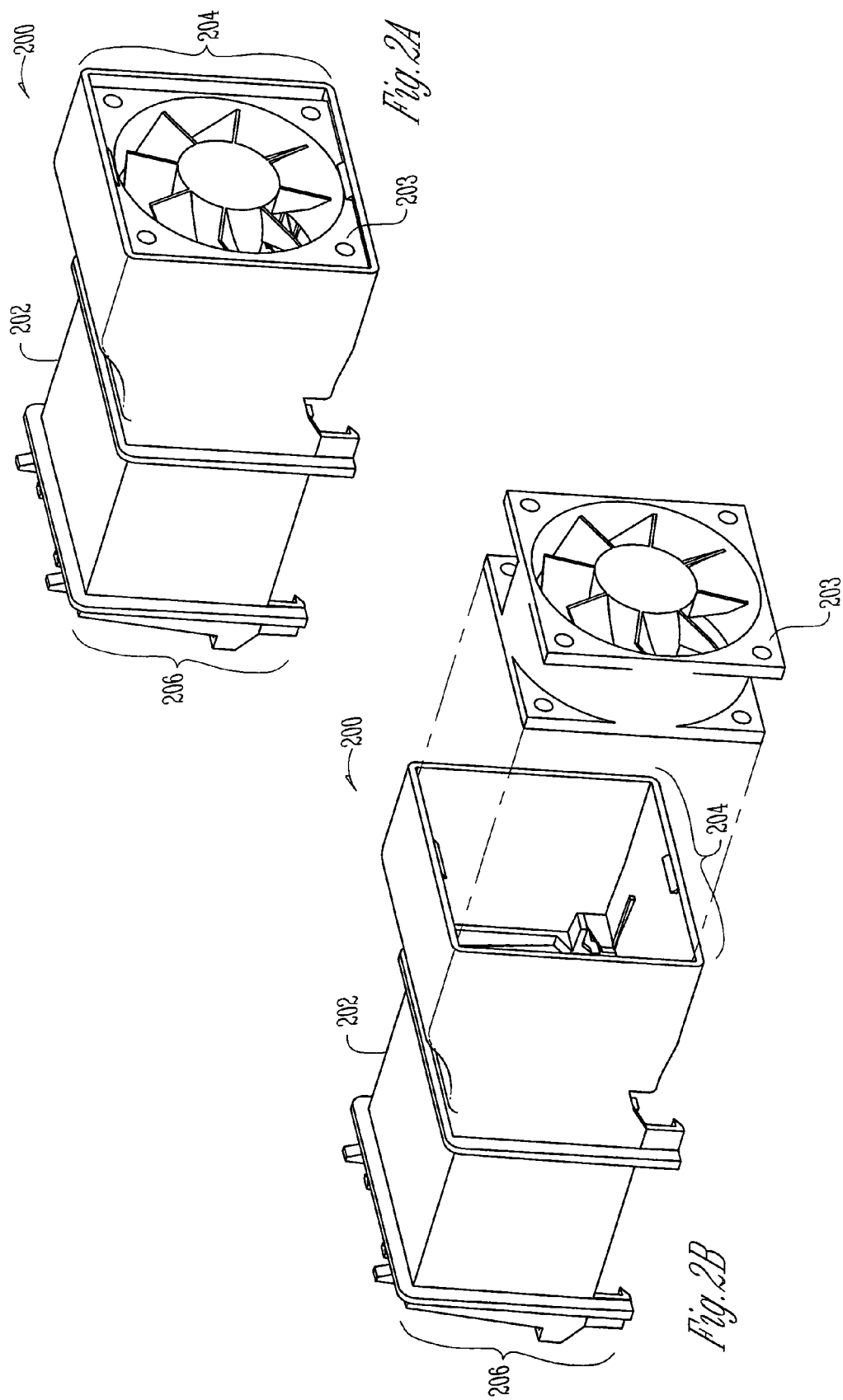

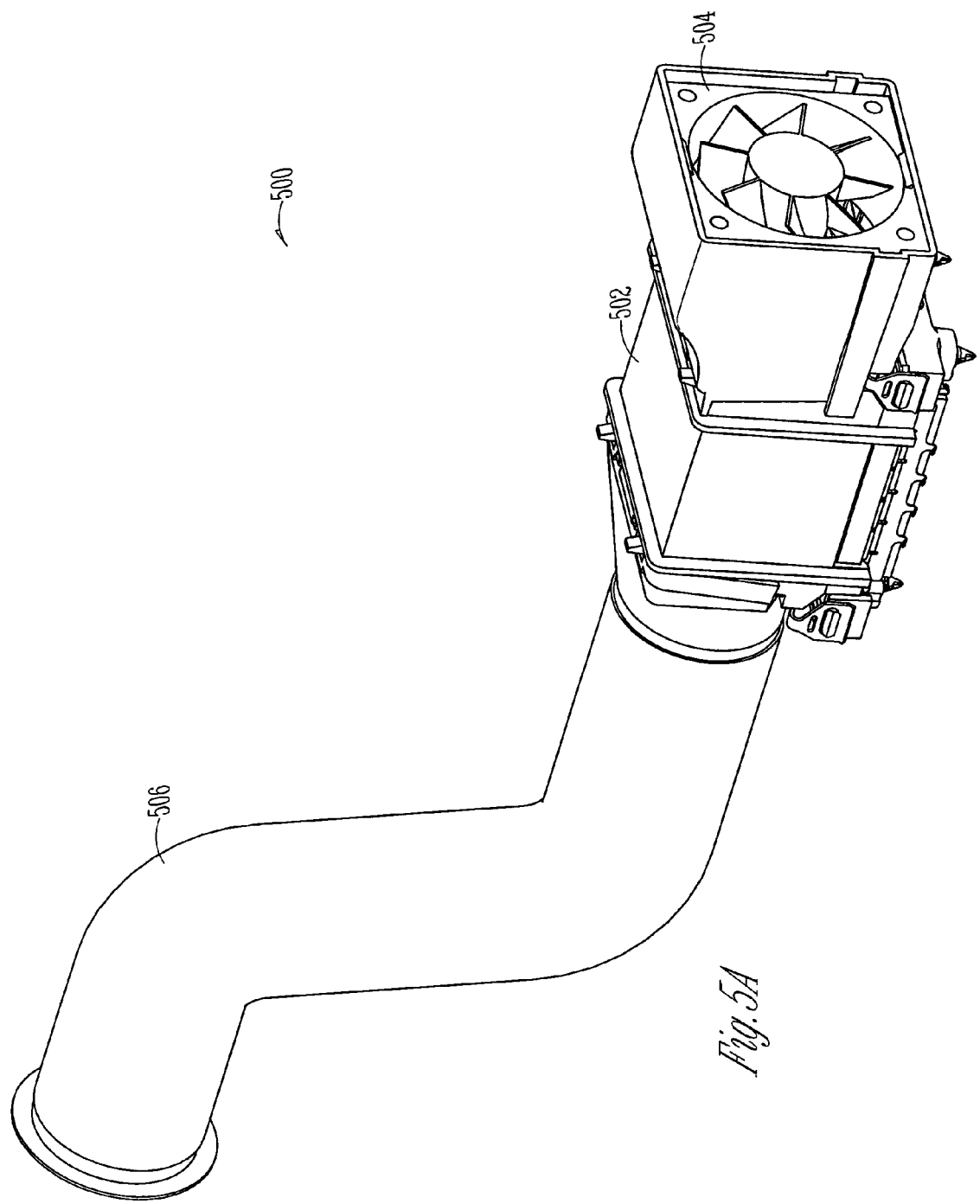

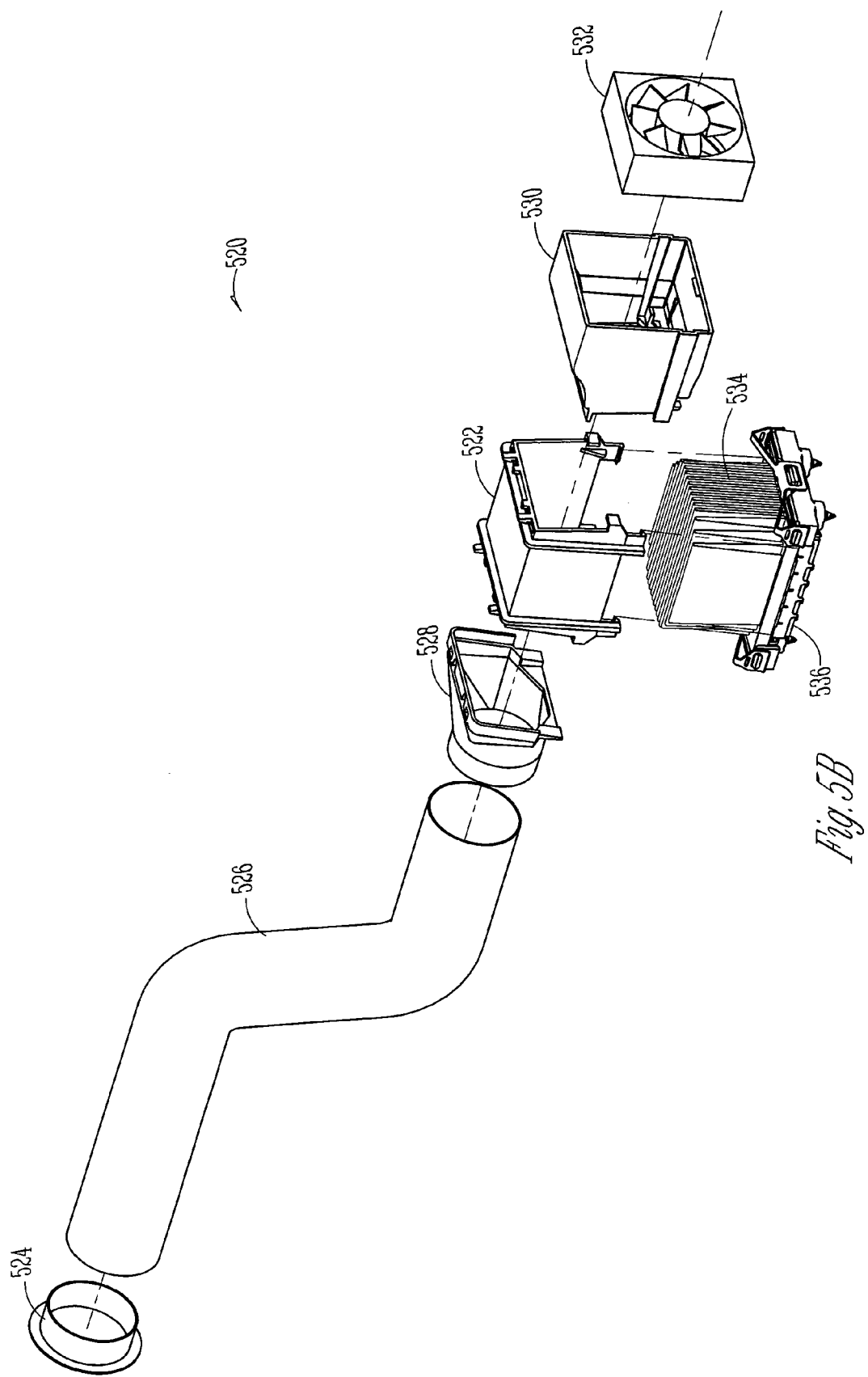

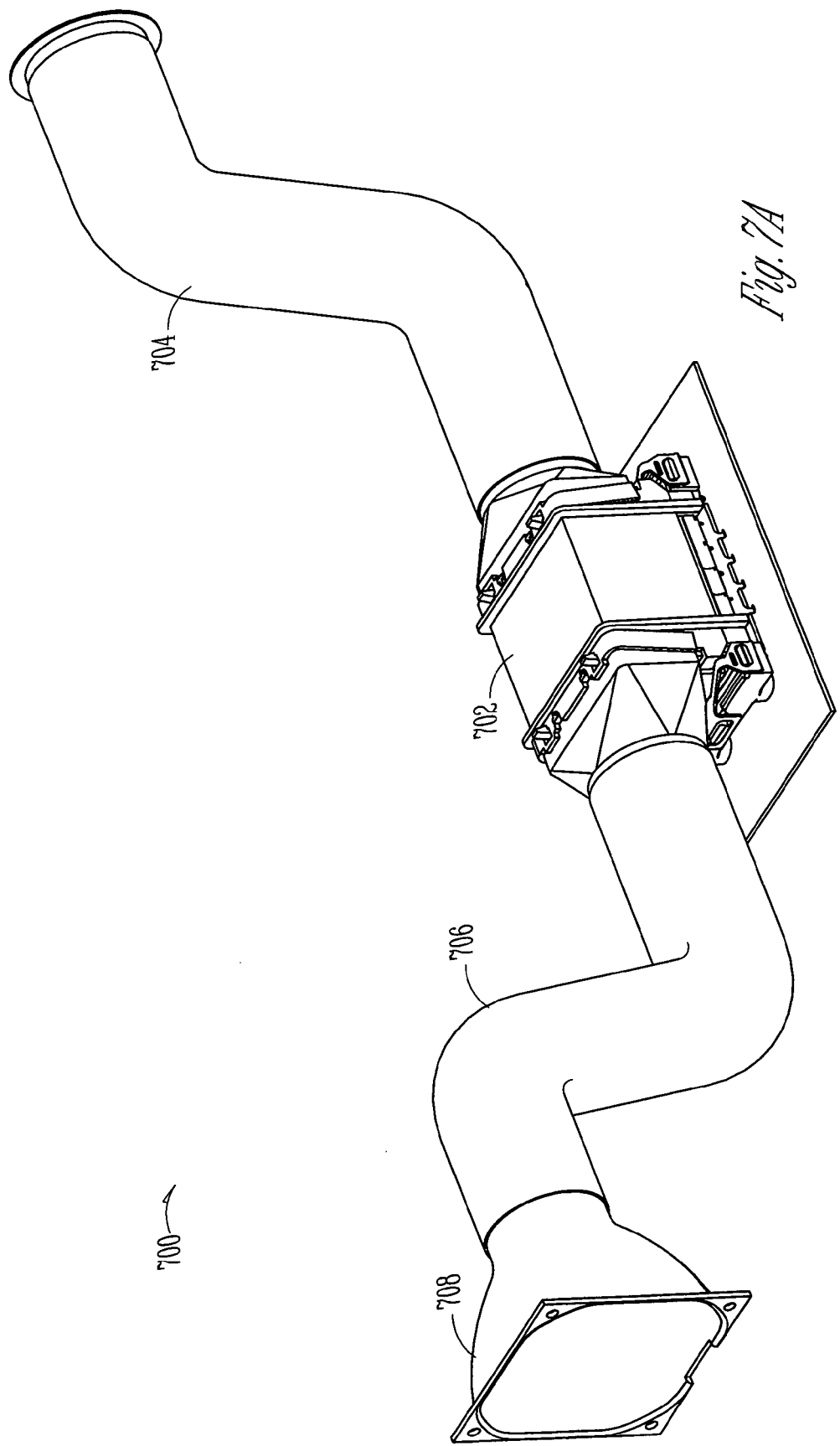

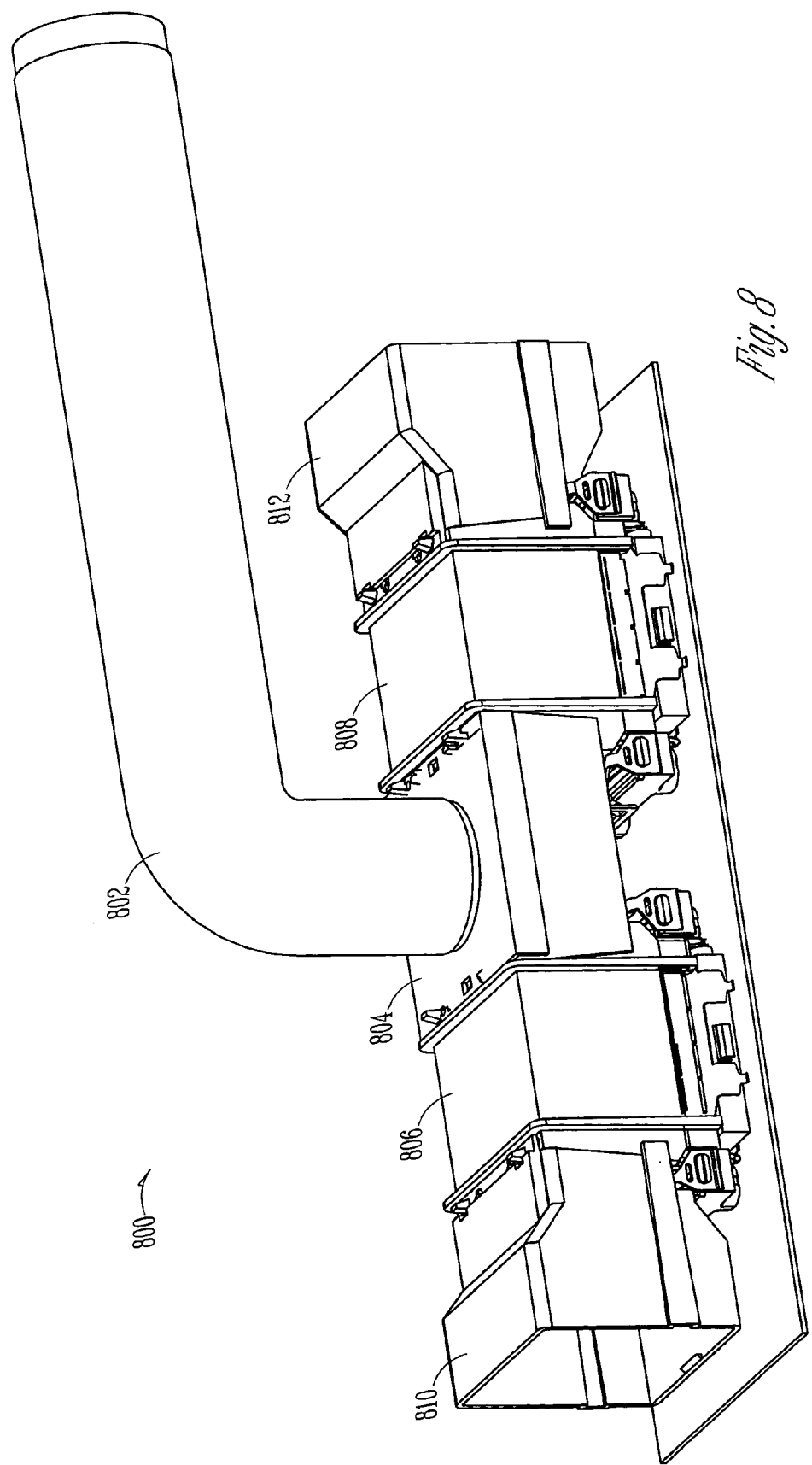

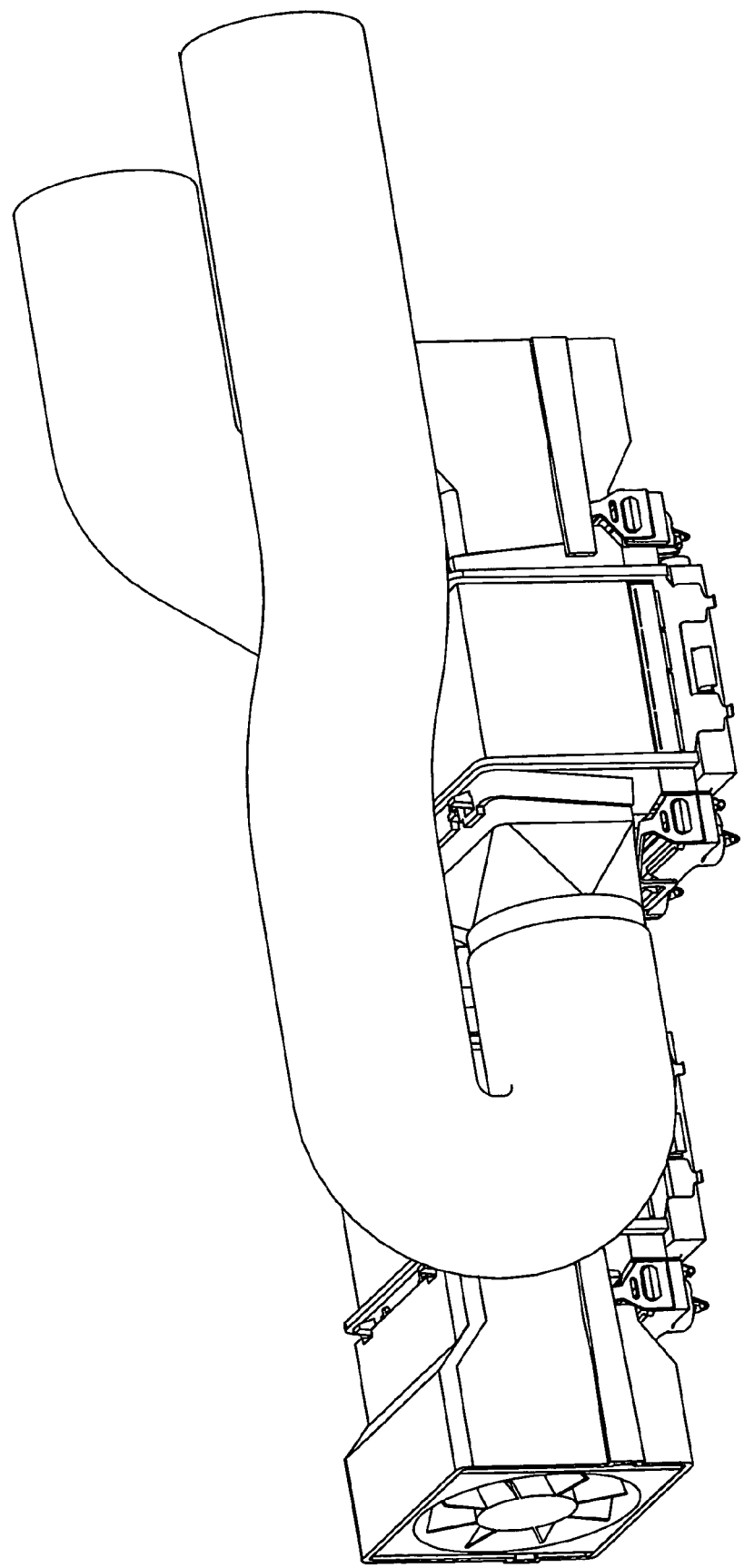

METHOD AND APPARATUS FOR DISSIPATING HEAT FROM AN ELECTRONIC DEVICE

TECHNICAL FIELD OF THE INVENTION

The present invention relates generally to the field of electronic devices and, in particular, the present invention relates to thermal management of electronic devices.

BACKGROUND

Electronic devices dissipate heat during operation. Thermal management refers to the ability to keep temperature-sensitive elements in an electronic device within a prescribed operating temperature. Thermal management has evolved to address the increased temperatures created within such electronic devices as a result of increased processing speed/power of the electronic devices. Historically, electronic devices were cooled by a natural convection thermal management technique. That is, the cases or packaging of these prior art electronic devices were designed with openings (e.g., slots) strategically located to allow warm air to escape and cooler air to be drawn in.

However, with the advent of high performance processors such as the Intel Itanium® processor, electronic devices have required more innovative thermal management. For example, in the last several years processing speeds of computer systems have climbed from 25 MHZ to over 1000 MHZ. Each of these increases in processing speed and power generally carry with it a "cost" of increased heat dissipation. Corresponding improvements in thermal management technology accompanied, out of necessity, such technological improvements. Natural convection was no longer sufficient to provide proper thermal management.

Several methods have been employed for cooling high performance electronic devices such as processors. A common method of cooling such a processor is by the use of a fan heat sink. FIG. 1A is a diagram of a prior art fan heat sink 100. As shown in FIG. 1A, an axial fan 102 is attached by a fan holder 104 to a heat sink 106 atop a processor. The fan heat sink 100 blows air across the heat sink 106 to remove the heat dissipated by the processor. To date, the best fan heat sinks are not thermally efficient enough to cool the new higher powered processors. One reason that previous fan heat sinks are not thermally efficient is that the fan forces air down on the processor. One problem with a fan that is positioned atop a heat sink, such as in FIG. 1A, is that the fan is too closely located to the fins of the heat sink to generate fully developed air flow. There is a dead space in the air flow which is caused by the fan hub. A fan heat sink such as the fan heat sink shown in FIG. 1A is not capable of providing fully developed air flow.

Another approach to cooling high performance processors is the use of passive heat sinks in combination with an axial system fan. One of the problems with the use of a large system fan is blowby. As used herein, the term "blowby" refers to air that is moved by a fan, but does not pass through the fins of a heat sink or over the electronic component itself. For example, when a large system fan is used in conjunction with a heat sink to cool an electronic component, a large percentage of the air moved by the system fan does not go through the heat sink. As a result, large system fans are not an efficient thermal solution for cooling a specific electronic component. Furthermore, some of these new high performance systems require multiple fans to maintain proper operating temperatures. However, the additional fans necessary for previous forced-air cooling systems result not only in an added expense for manufacturers of such electronic devices, but are often bulky and require an inordinate amount of real estate within the chassis. Another problem with the use of multiple system fans is the noise generated by the fans.

In recent years, power dissipation from components in a computer system chassis has increased in small increments for most computer system components except for processors. FIG. 1B is a bar graph comparing the power dissipation for various computer system components designed in 1999 and 2000. As shown in FIG. 1B, power dissipation for hard drives, memory, and chipsets designed in 2000 increased by only a few watts compared to similar components designed in 1999. Yet, even for computer systems designed in 2000, the power dissipation for each of the following is still under 20 Watts: hard drives, memory, chipsets and add-in cards. However, the power dissipated by a high performance processor has nearly doubled between 1999 and 2000 (as indicated by the arrow 108 in FIG. 1B). For example, in 1999 the power dissipation for a processor was generally between 30 and 40 watts. However, the power dissipation for some high performance processors currently being designed is as much as 70 watts. As shown in FIG. 1B, the power dissipation from processors has increased by about 30 watts in a one year period. Furthermore, it is anticipated that in future years the power dissipation of processors will increase even more dramatically.

The cooling systems currently being used, such as fan heat sinks and large system fans as described above, are not sufficient to effectively cool such high performance processors. What is needed is a thermal solution to provide high performance cooling for particular electronic components with disproportionately higher power dissipation.

For these and other reasons, there is a need for a heat dissipation device to efficiently dissipate the heat generated by high performance electronic devices.

BRIEF DESCRIPTION OF THE DRAWINGS

FIG. 2A is a perspective view of one embodiment of an apparatus for dissipating heat from an electronic device.

FIG. 2B is an exploded view of the embodiment of the apparatus shown in FIG. 2A.

FIG. 5A is a perspective view of an example embodiment of an apparatus for cooling an electronic device.

FIG. 5B is an exploded view of the apparatus shown in FIG. 5A.

FIG. 7A is a perspective view of an alternate embodiment of an apparatus which utilizes a system fan for cooling an electronic device.

FIG. 8 is a perspective view of an example embodiment of an apparatus with two electronic components in an in-line configuration.

FIG. 10 is a perspective view of a dual processor configuration in which each processor housing is coupled to an air duct for fresh air intake.

DETAILED DESCRIPTION

Figure 1A:
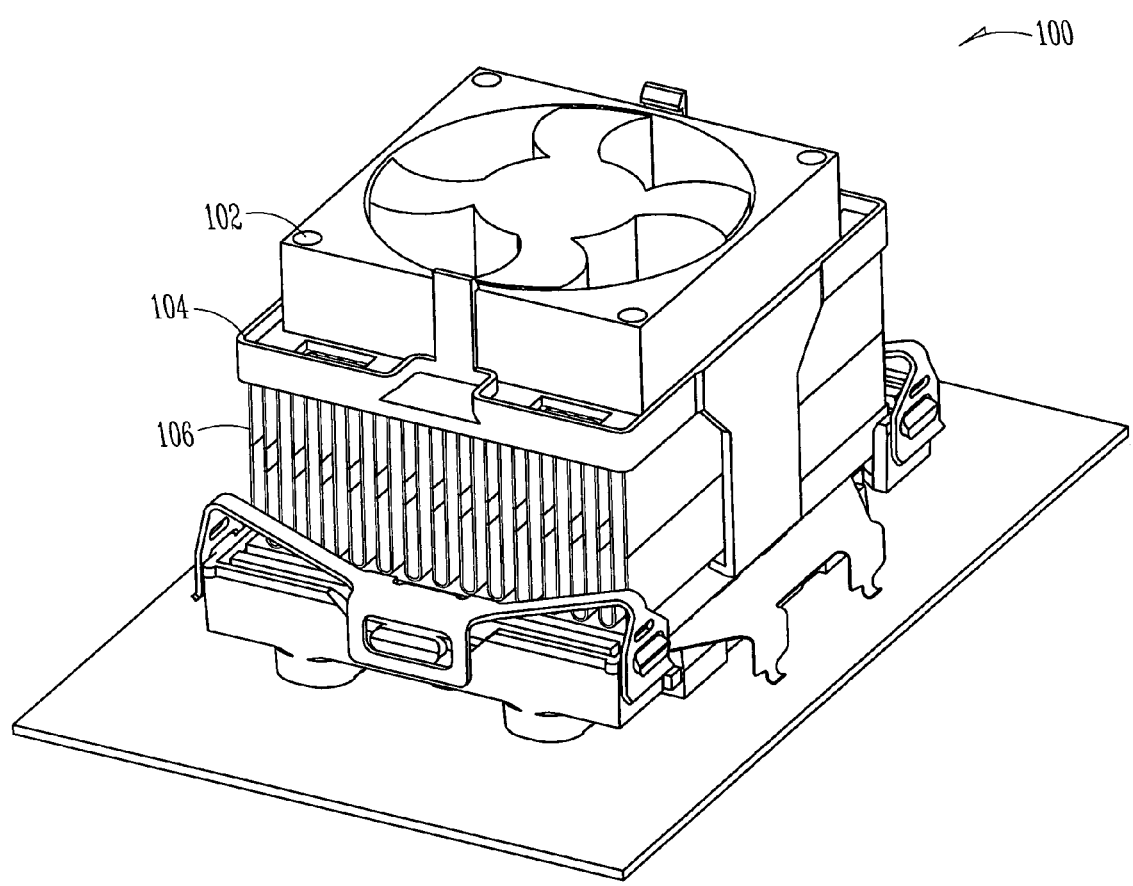
FIG. 1A is a perspective view of a prior art fan heat sink.
Figure 1B:
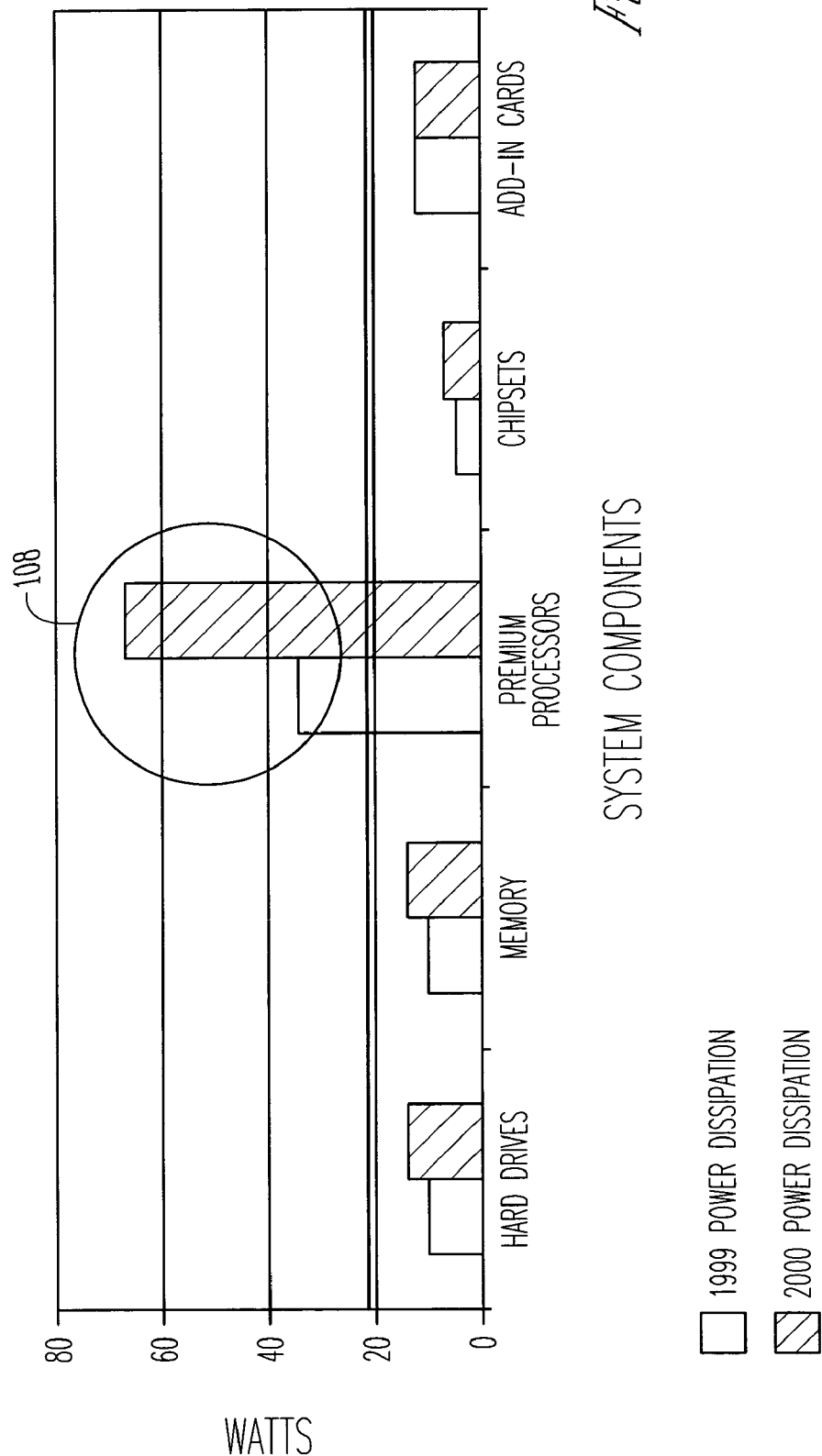
FIG. 1B is a bar graph comparing the power dissipation for various computer system components designed in 1999 and 2000.

In the following detailed description of the invention reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and electrical changes may be made, without departing from the scope of the present invention.

A method and apparatus for dissipating heat from an electronic device is described. The method and apparatus efficiently dissipates the heat generated by high performance electronic devices.

FIG. 2A is a perspective view of one embodiment of an apparatus for dissipating heat from an electronic device. The apparatus for dissipating heat 200 shown in FIG. 2A comprises a housing 202 and an air moving device 203.

The housing 202 is adapted to be closely fitted to a heat sink. The housing 202 has a first end 204 and a second end 206. The first end 204 is adapted to hold an air moving device 203. In one embodiment, the housing 202 attaches to a processor socket. In one embodiment, various cooling attachments can be attached to the first end 204 and the second end 206 of the housing 202 to provide a multitude of thermal solutions for high performance electronic devices.

The air moving device 203 is adapted to be coupled to the first end 204 of the housing 202. The air moving device 203 is used to move air through the housing 202. In some embodiments, the air moving device 203 acts an exhaust and pulls air over the heat sink. In alternate embodiments, the air moving device 203 blows air over the heat sink. In one embodiment, the air moving device 206 is any generally available axial fan. The diameter of the fan may be between about 20 millimeters and about 120 millimeters. In an example embodiment, a heat dissipation apparatus such as the apparatus 200 shown in FIGS. 2A and 2B is capable of cooling about a 67 watt processor with a 60 millimeter fan. However, other comparable air moving devices may be employed instead of an axial fan without diverting from the scope of the invention. For example, a blower may be used as an air moving device.

FIG. 2B is an exploded view of the example embodiment of the apparatus shown in FIG. 2A. As shown in FIG. 2B, the apparatus for dissipating heat 200 comprises a housing 202 and an air moving device 203 adapted to be coupled to the housing 202. The housing 202 has a first end 204 and a second end 206. In the embodiments shown in FIGS. 2A and 2B, the housing 202 is a single piece in which the air moving device 203 fits into. However, in alternate embodiments, the housing 202 is designed as multiple pieces that fit together to form a housing.

The apparatus for dissipating heat shown in FIGS. 2A and 2B is thermally more efficient than previous heat dissipation systems because the apparatus substantially eliminates blowby. The example embodiments of the apparatus for dissipating heat shown in FIGS. 2A and 2B (as well as in FIGS. 3–10) ensure that nearly all of the air that a fan is capable of moving is channeled through the fins of a heat sink. According to embodiments of the present invention, there is no place else for the air being moved by the fan to go, but through the fins of a heat sink. In contrast, previous systems with large system fans create a large amount of airflow, but much of that airflow does not flow through the heat sink's fins. Thus, the present system substantially eliminates blowby and, as a result, increases the thermal efficiency of the fan used to cool the electronic device. Furthermore, because the system uses a small fan, this system is much quieter acoustically.

Figure 3:
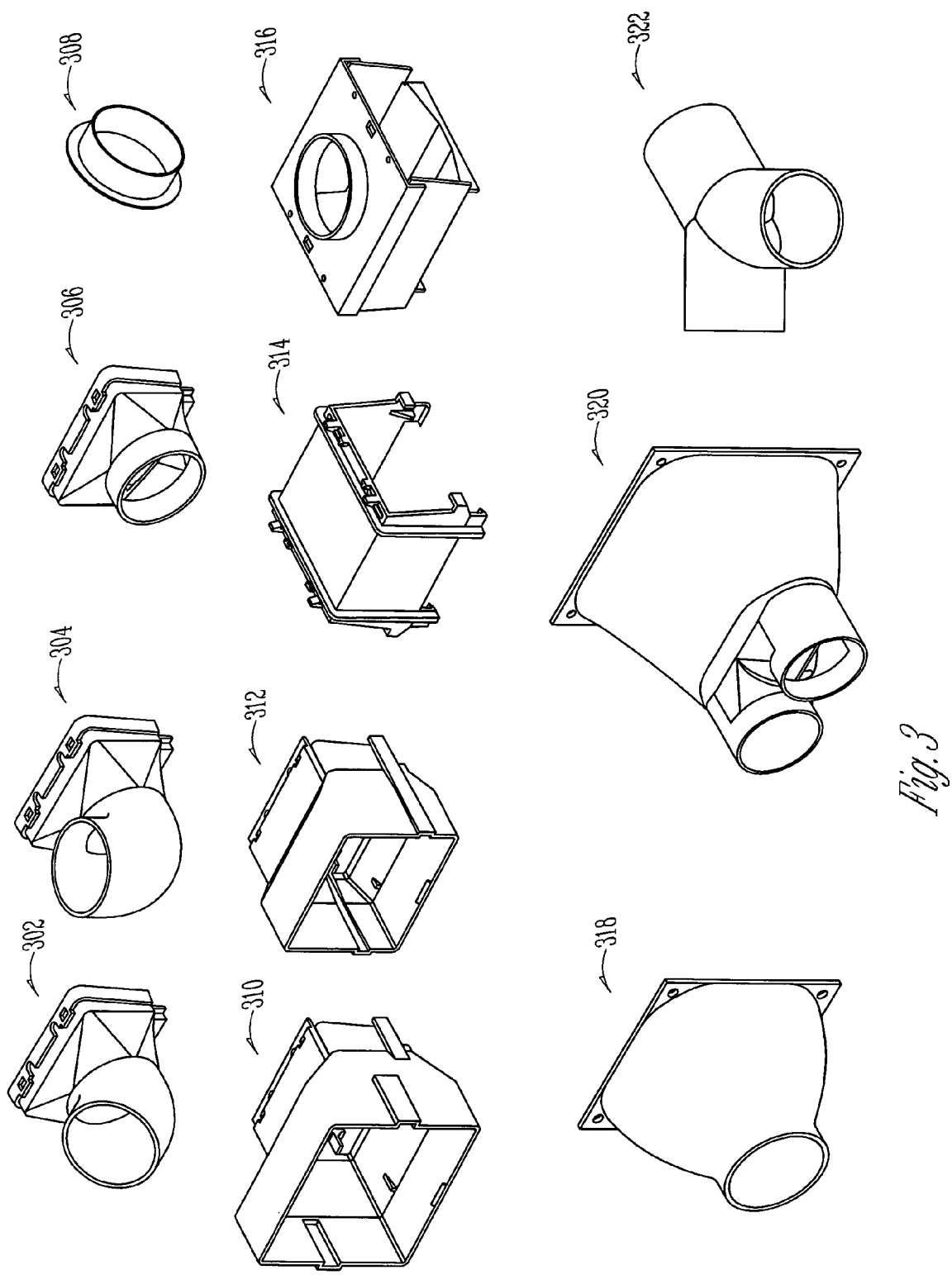
FIG. 3 is a perspective view of cooling attachments comprising a kit of parts for an electronic component cooling system according to one embodiment of the invention.

FIG. 3 is a perspective view of interchangeable cooling attachments comprising a kit of parts for an electronic component cooling system. In one embodiment, the kit of parts comprises a heat sink housing 314 and one or more interchangeable cooling attachments 302, 304, 306, 308, 310, 312, 316, 318, 320, and 322 to provide a scalable and universally applied thermal solution for high heat generating electronic components. In one embodiment, the interchangeable cooling attachments 302, 304, 306, 308, 310, 312, 316, 318, 320, and 322 are molded pieces of plastic.

In one embodiment, the one or more cooling attachments include one or more housing air duct adapters 302, 304, 306, an air inlet chassis adapter 308, one or more housing fan adapters 310, 312, a housing connector 316, one or more chassis fan adapters 318, 320, and a splitter 322. The housing air duct adapters 302, 304, 306 are adapted to attach to the housing 314 and to receive an air duct such as an air duct in the shape of a hose (as shown in FIGS. 5A and 5B). The first housing air duct adapter 302 is adapted to receive the air duct at about a 45 degree angle. The second housing air duct adapter 304 is adapted to receive the air duct at about a 90 degree angle. The third housing air duct adapter 306 is not angled.

The air inlet chassis adapter 308 is adapted to be secured to an external vent on the chassis. The air inlet chassis adapter 308 may be secured in any manner. In one example the air inlet chassis adapter 308 is secured with an adhesive.

Figure 4A:
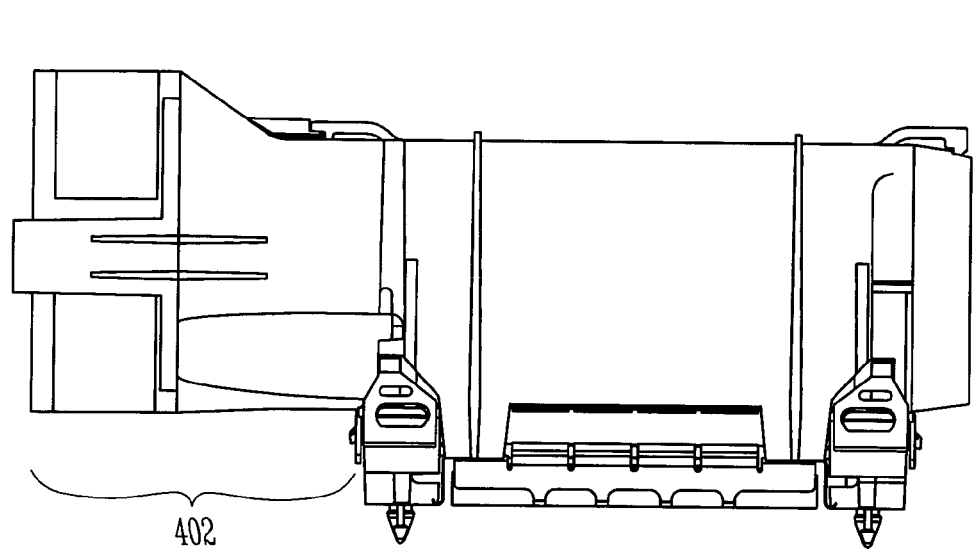
FIGS. 4A and 4B are side views of two example configurations of the housing shown in FIGS. 2A and 2B.
Figure 4B:
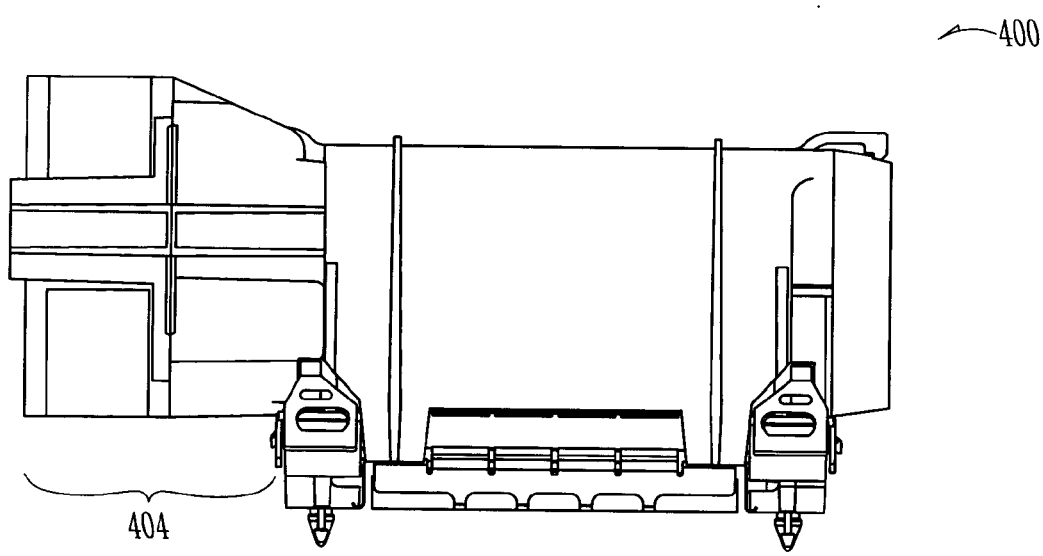

The fan housing adapters 310, 312 are adapted to attach to a heat sink and to receive a fan. The first fan housing adapter 310 is an extended holder that positions the fan at a distance from the heat sink that achieves fully developed air flow (as shown in FIG. 4A). The second fan housing adapter 312 is a contracted fan holder that positions the fan closer to the heat sink than the first fan housing adapter 310 (as shown in FIG. 4B).

The housing connector 316 is adapted to create a bridge between two housings 314 when cooling multiple electronic devices positioned in an in-line configuration (such as shown in FIG. 8).

The chassis fan adapters 318, 320 are adapted to be secured to an external vent on the chassis and to be coupled to an air duct. A single chassis fan adapter 318 allows air from a single air duct to vent outside the chassis. A dual chassis fan adapter 320 allows air from two air ducts to vent outside the chassis. In an alternate embodiment, the chassis fan adapters 318, 320 generate a flow of air from outside the chassis into the chassis and the electronic device cooling system.

The splitter 322 is adapted to couple a single air duct to dual air ducts.

In one embodiment, the various cooling attachments 302, 304, 306, 308, 310, 312, 316, 318, 320, 322 can be attached to the housing 314 to provide a multitude of thermal solutions. The housing 314 may be shaped to fit over any size or shape heat sink.

Figure 6A:
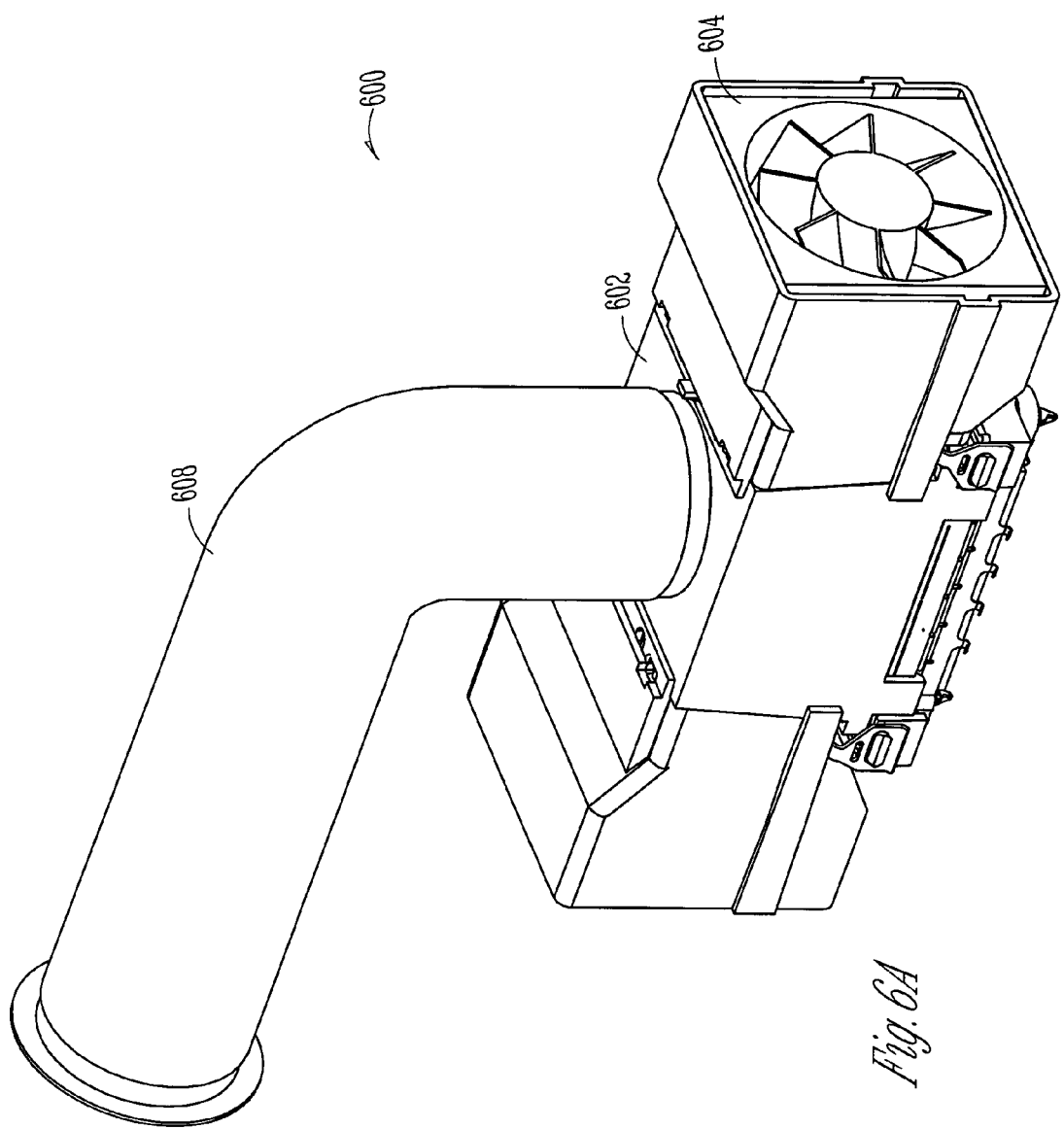
FIG. 6A is a perspective view of an alternate embodiment of an apparatus which utilizes redundant fans for cooling an electronic device.
Figure 6B:
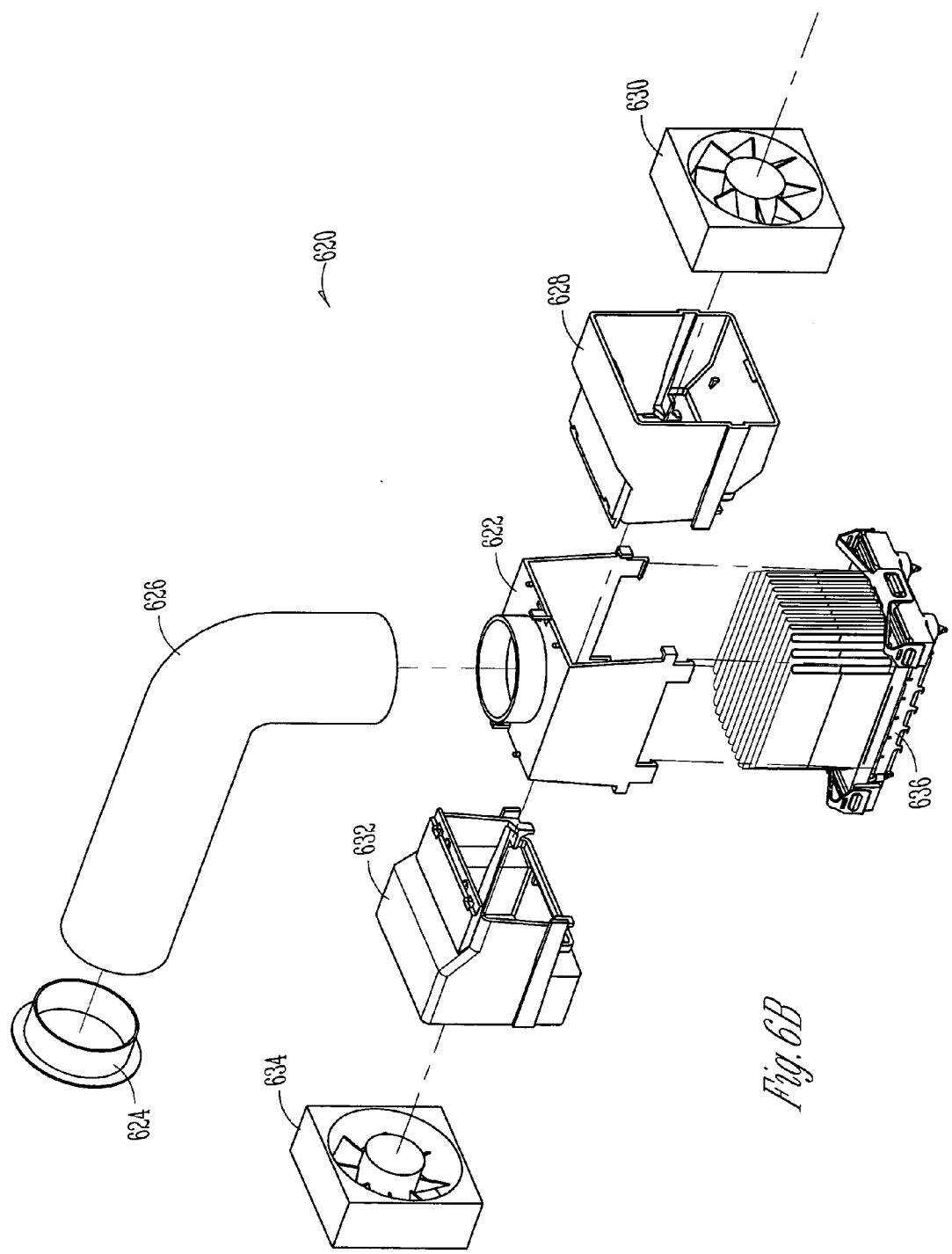
FIG. 6B is an exploded view of the apparatus shown in FIG. 6A.

A kit of parts for an electronic component cooling system may be comprised of any combination of one or more housings 314 and the interchangeable cooling attachments 302, 304, 306, 308, 310, 312, 316, 318, 320, 322 shown in FIG. 3. Furthermore, such a kit of parts is not limited to the interchangeable cooling attachments shown in FIG. 3. For example, the kit of parts may also comprise one or more air ducts. In one embodiment, the air ducts are in the form of a hose and have a diameter to match the diameter of the housing air duct adapters 302, 304, 306. In another example, the kit of parts further comprises a second housing 314 which is adapted to receive an air intake duct from the top of the housing. In this case the house has an opening on top for an air duct. An example embodiment of a housing with a top entry opening is shown in FIGS. 6A and 6B.

FIG. 4A is a side view of a housing 400 such as the housing shown in FIGS. 2A and 2B. The housing includes an extended fan holder 402. The extended fan holder may be a separate part that attaches to the housing. Alternatively, the housing 400 is manufactured as a single part including the extended fan holder 402. When the extended fan holder 402 is used in an apparatus for cooling an electronic device, the fan which is held by the extended fan holder 402 achieves fully developed air flow. When using the extended fan holder 402, it is possible to adequately cool an electronic device at slower speeds because the fan is able to achieve fully developed air flow. The extended fan holder 402 positions the fan at a distance from a heat sink enclosed by the housing 400 that is about equal to the diameter of the fan.

FIG. 4B is a side view of an alternate embodiment of the housing 400 shown in FIG. 4A. As shown in FIG. 4B, the housing 400 includes a contracted fan holder 404. Like the extended fan holder shown in FIG. 4A, the contracted fan holder 404 may be a separate part that attaches to the housing or the contracted fan holder 404 may be formed as part of the housing. The contracted fan holder positions the fan at a distance from a heat sink enclosed by the housing 400 that is less than the diameter of the fan.

In one embodiment, an apparatus for dissipating heat from an electronic device is configured with either an extended fan holder according to FIG. 4A or a contracted fan holder according to FIG. 4B based on the requirements of the particular thermal situation and the space available in a computer system chassis. In the example embodiment shown in FIG. 4A, the extended fan holder 402 is 2.22 inches long and the total length of the housing with the extended fan holder 402 is 6.42 inches. In the example embodiment shown in FIG. 4B, the contracted fan holder 404 is one-half inch shorter than the extended fan holder 402 in FIG. 4A. The contracted fan holder 404 is 1.72 inches long and the total length of the housing with the contracted fan holder 404 is 5.92 inches. Thus, use of the extended fan holder 402 takes up more space on a circuit board in a chassis and use of the contracted fan holder 404 requires less space on the circuit board in a chassis.

In one embodiment, a system integrator selects either an extended fan holder or a contracted fan holder from a kit of parts. The fan holder selected depends on the configuration of the circuit board and the space available around the electronic device to be cooled. In an alternate embodiment, a kit of parts such as in FIG. 3 includes an adjustable fan holder. When the apparatus for cooling an electronic device is assembled, the adjustable fan holder is adjusted to function as either an extended fan holder or a contracted fan holder based on space available around the electronic device to be cooled.

FIGS. 5–10 illustrate various configurations of housings and interchangeable cooling attachments from the kit of parts shown in FIG. 3. The invention is not limited to the configurations shown in FIGS. 5–10. Alternate embodiments are contemplated having the interchangeable cooling attachments and one or more housings arranged in a multitude of configurations.

FIG. 5A is a perspective view of an example embodiment of an apparatus for cooling an electronic device. In one embodiment, the apparatus 500 shown in FIG. 5A comprises a housing 502, a fan 504, and an air duct 506. The housing 502 is adapted to be closely fitted to a heat sink. The housing 502 contains and guides air movement through the plurality of fins of a heat sink. The air moving device 504 is coupled to a first end of the housing 502. In one embodiment, the air moving device pulls air through the enclosure created by the housing and exhausts the air into a chassis of a computer system. The air duct 506 directs air external to the chassis to the housing 502. In one embodiment, the cool air intake is any opening to the exterior of the chassis. The arrows in FIG. 5A indicate that air enters the apparatus 500 through the air duct 506 and exits the apparatus 500 through the fan 504. By pulling air from the exterior of the chassis through the enclosure created by the housing 502, unheated air passes over the electronic device and through the fins of the heat sink. In the embodiment, the air duct 506 and the housing 502 channel air through the fins of the housing in a manner that substantially reduces blowby.

FIG. 5B is an exploded view of one embodiment of the apparatus shown in FIG. 5A. As shown in FIG. 5B, the apparatus for cooling an electronic device 520 is comprised of a housing 522 and various cooling attachments selected from a kit of parts such as the kit of parts shown in FIG. 3. The various cooling attachments that are assembled to form the apparatus 520 include an air inlet chassis adapter 524, an air duct 526, a housing air duct adapter 528, a housing fan adapter 530, and a fan 532.

The air inlet chassis adapter 524 is coupled to an opening in the chassis and to the air duct 526. The air duct 526 is also coupled to the housing air duct adapter 528. The housing air duct adapter 528 is coupled to the housing 522. The housing 522 is coupled to the housing fan adapter 530 and the housing fan adapter 530 holds the fan 532. The housing fan adapter 530 attaches to the housing 522 at the end opposite of the housing air duct adapter 528.

In an example embodiment, the air duct 526 may be metal or plastic. The air duct 526 may also be rigid or flexible. For example, in one embodiment the air duct 526 takes the form of a flexible plastic hose. In another embodiment, such a flexible hose is also expandable. For example, the flexible hose is molded as an accordion-like plastic hose. The accordion-like hose has folds and bends to allow the hose to expand and contract as needed. The use of an expandable, flexible hose allows an air duct to be added to a cooling system without having to modify the existing computer system board layout. The expandable, flexible hose is merely routed around the existing computer system components.

In one embodiment, the housing 522 clamps to a heat sink 534. The housing 522 contains and guides air movement through the plurality of fins of the heat sink 534 which is thermally coupled to a processor 536. In one embodiment, the housing air duct adapter 528 and the housing fan adapter 530 function as end caps on the housing 522 to lock the housing in place so that the housing does not move horizontally on the heat sink. The various cooling attachments shown in FIG. 5B are for example purposes only. The apparatus for cooling an electronic device may be formed with additional or differing cooling attachments. For example, in an alternate embodiment, the housing air duct adapter 528, the housing 522, and the housing fan adapter 530 are a single part.

FIG. 6A is a perspective view of an alternate embodiment of an apparatus which utilizes redundant fans for cooling an electronic device. In one embodiment, the apparatus 600 shown in FIG. 6A comprises a housing 602, a first fan 604, a second fan (shown in FIG. 6B), and an air duct 608. The air duct 608 directs a flow of air external to the chassis to the housing 602. The housing 602 is adapted to receive an air duct 608 from the top of the housing. The first fan 604 is coupled to a first end of the housing 602. The second fan is coupled to the second end of the housing. In one embodiment, the first fan 604 and the second fan pull air through the enclosure created by the housing 602 and exhaust the air into a chassis of a computer system. The arrows in FIG. 6A indicate that air enters the apparatus 600 through the air duct 608. The air enters the housing 602 in the middle and is exhausted out both sides of the housing 602. As in FIGS. 5A and 5B, the air duct 608 and the housing 602 channel air through the fins of the heat sink in a manner that substantially reduces blowby.

FIG. 6B is an exploded view of the apparatus shown in FIG. 6A. As shown in FIG. 6B, the apparatus 620 for cooling an electronic device is comprised of a top entry housing 622 and various cooling attachments from the kit of parts shown in FIG. 3. The various cooling attachments that are assembled to form the apparatus 620 include an air inlet chassis adapter 624, an air duct 626, a first housing fan adapter 628, a first fan 630, a second housing fan adapter 632, and a second fan 634.

The air inlet chassis adapter 624 is coupled to an opening in the chassis and to the air duct 626 The air duct 626 is also coupled to the housing 622 at the top entry. The first housing fan adapter 628 holds the first fan 630 and is coupled to the housing 622. The second housing fan adapter 632 holds the second fan 634 and is coupled to the end of the housing 622 that is opposite the first fan 630. The housing is coupled to a processor and heat sink assembly 636.

An advantage of the configuration shown in FIGS. 6A and 6B is the existence of redundant fans. Redundant fans are particularly useful for redundant cooling in computer systems such as servers. In such systems, the first fan and the second fan both operate under normal operating conditions. However, if one of the fans fails, the other fan alone is adequate to cool the electronic device. Thus, in a redundant cooling situation, the dual fans provide twice the cooling capacity normally needed in case one of the fans fails.

The configuration in FIGS. 6A and 6B is also useful for extremely high powered processors. For situations of extreme heat dissipation, two fans may be necessary to cool an electronic device. For example, in the next decade it is anticipated that high performance processors may have power dissipation levels of 100–200 watts or even more.

The redundant fan configuration is not limited to the example embodiment shown in FIGS. 6A and 6B. For example, in an alternate embodiment the two exhaust fans draw air that is internal to the chassis through an opening on the top of the housing. In this example, the air duct shown in FIGS. 6A and 6B is omitted. This example configuration is applicable if the internal ambient air temperature in the chassis is adequate for cooling the processor. In another alternate embodiment, a housing with top entry and an air duct coupled to the top entry of the housing is used with a single fan and an end cap on the opposite end rather than with redundant fans.

FIG. 7A is a perspective view of an example embodiment of an apparatus which utilizes a system fan for spot cooling of an electronic device. In one embodiment, the apparatus 700 shown in FIG. 7A comprises a housing 702, a first air duct 704, a second air duct 706, and a chassis fan adapter 708. The chassis fan adapter 708 fits over a system fan. The chassis fan adapter 708 allows the system fan to be used to generate a flow of air through the fins of a heat sink. The system fan may be used to either exhaust or to pressurize the housing 702. The first air duct 704 may be attached to any air flow inlet or outlet in the chassis of a computer system.

Figure 7B:
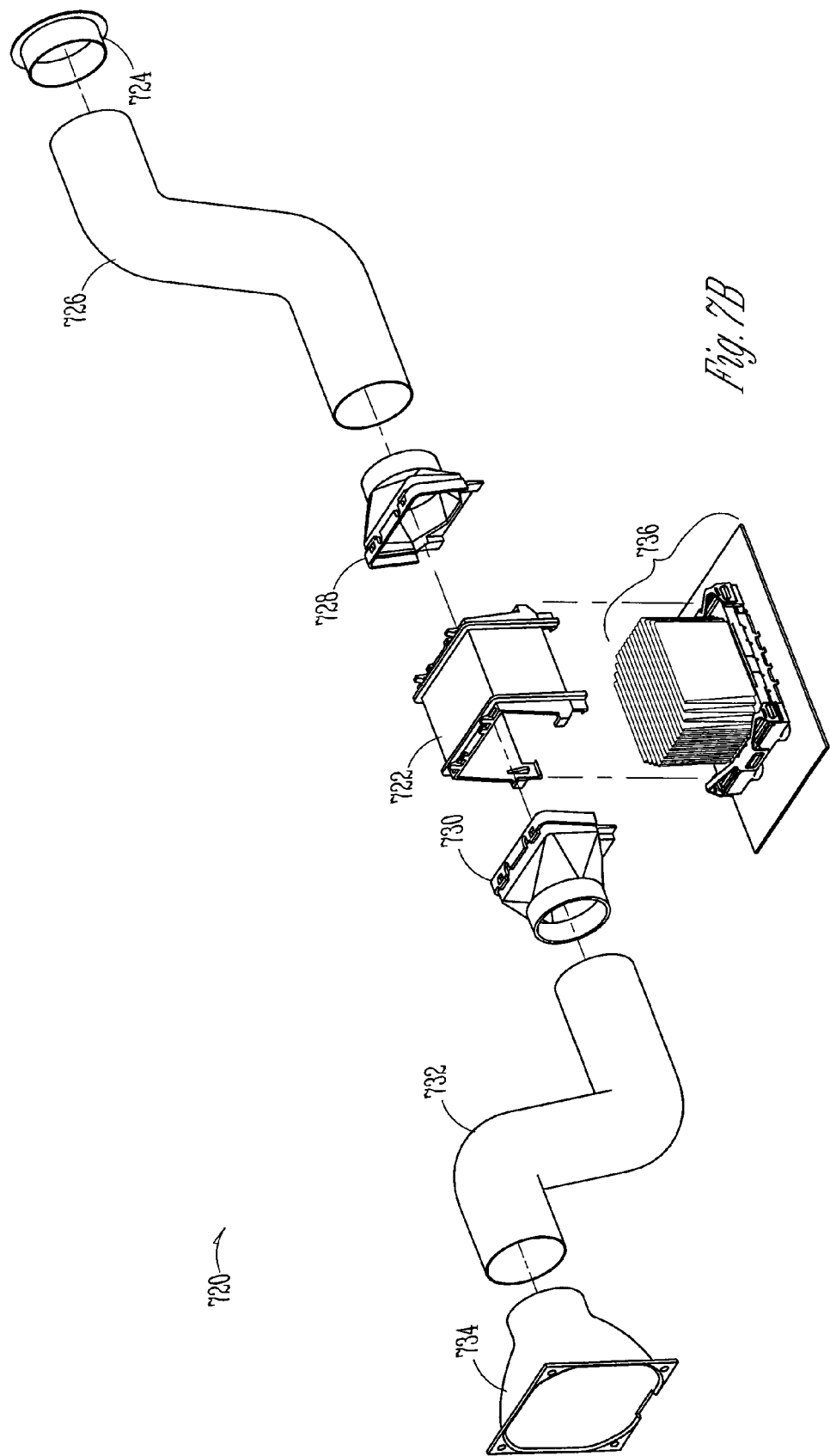
FIG. 7B is an exploded view of the apparatus shown in FIG. 7A.

FIG. 7B is an exploded view of the apparatus shown in FIG. 7A. As shown in FIG. 7B, the apparatus for cooling an electronic device 720 is comprised of a housing 722 and various cooling attachments from the kit of parts shown in FIG. 3. The various cooling attachments that are assembled to form the apparatus 720 include an air inlet chassis adapter 724, a first air duct 726, a first housing air duct adapter 728, a second housing air duct adapter 730, a second air duct 732, and a chassis fan adapter 734.

The air inlet chassis adapter 724 is coupled to an opening in the chassis and to the first air duct 726. The first air duct 726 is also coupled to the first housing air duct adapter 728. The first housing air duct adapter 728 is coupled to the housing 722. The second housing air duct adapter 730 is coupled to the end of the housing 722 that is opposite the first housing air duct adapter 728. The housing is also coupled to a processor and heat sink assembly 736. The second housing air duct adapter 730 is coupled to a second air duct 732. The second air duct 732 is coupled to the chassis fan adapter 734. The embodiment shown in FIGS. 7A and 7B allows air moved by a system fan to be channeled to a single device for high performance spot cooling.

Figure 9:
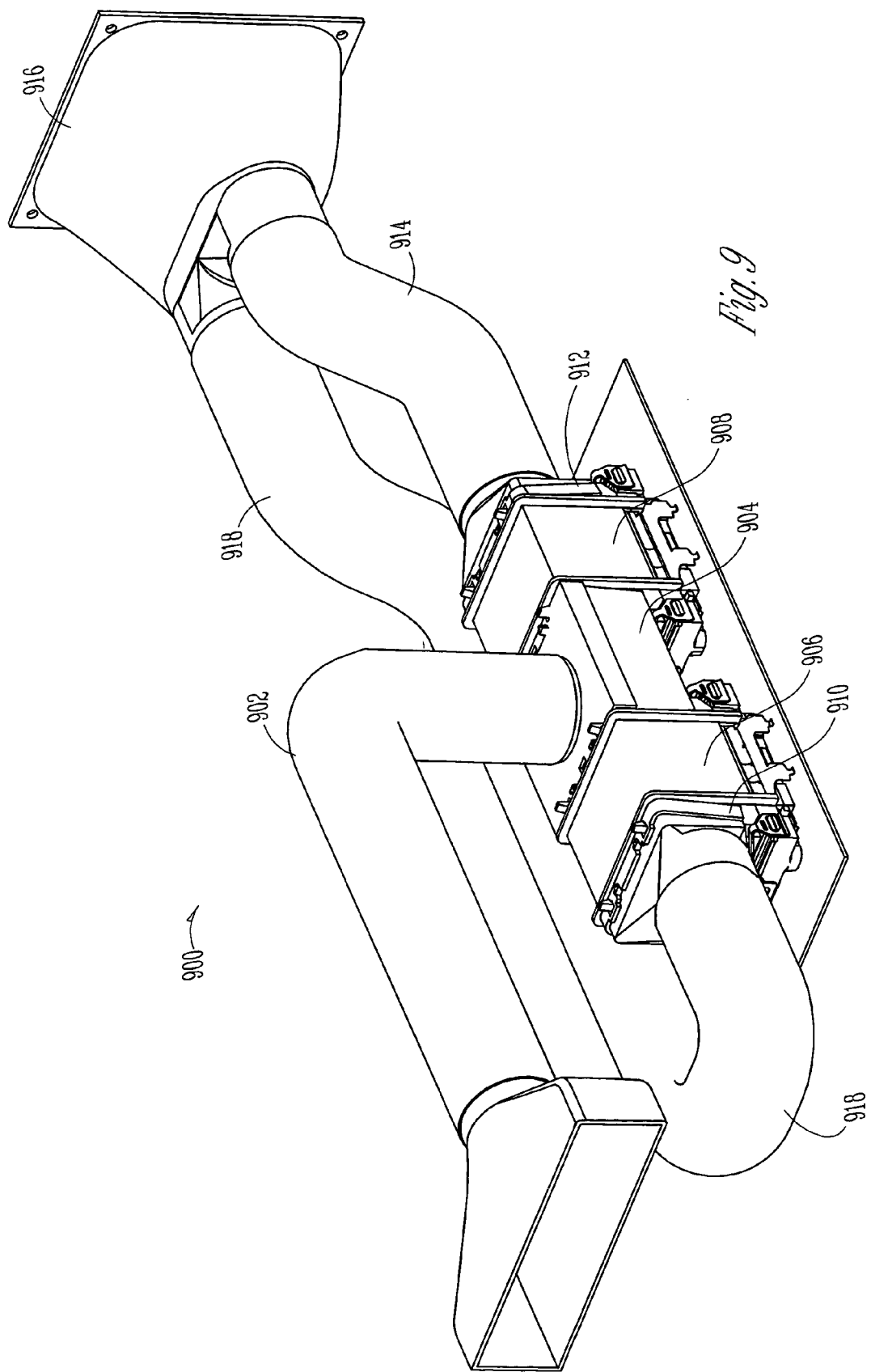
FIG. 9 is a perspective view of an alternate embodiment of the apparatus in FIG. 8.

The example embodiments shown in FIGS. 8, 9 and 10 illustrate an apparatus for cooling multiple electronic devices. FIG. 8 is a perspective view of an example embodiment of an apparatus 800 with two processors in an in-line configuration. The apparatus 800 shown in FIG. 8 comprises an air duct 802 coupled to a housing connector 804. The housing connector 804 couples a first housing 806 fitted over a first processor and a second housing 808 fitted over a second processor. A first housing fan adapter 810 is coupled to the first housing 806. The first housing fan adapter 810 holds a first fan (not shown) which exhausts heated air from the first housing 806 into the system chassis. Likewise, the second housing fan adapter 812 is coupled to the second housing 808 which holds a second fan (also not shown). The second fan exhausts heated air from the second housing 808 into the computer system chassis.

The example embodiment shown in FIG. 8 provides exhaust fans on each side of a single air intake. This example embodiment allows for different processor configurations than in prior systems. In prior dual processor systems, it was not desirable to have processors in-line with one another because of a shadowing effect. Shadowing refers to effect that occurs when air flows in the same direction over processors in an in-line configuration. When the processors are positioned in-line with one another, heat is dissipated from the first processor into the air flow that is then used to cool the second processor. Prior systems typically staggered the processors to avoid a shadowing effect. However, one of the advantages of some embodiments of an apparatus for cooling an electronic component of the present invention is that multiple processors can be placed in-line with one another. This allows greater flexibility in the design and layout of integrated circuit boards.

In the example embodiment shown in FIG. 8, the apparatus for cooling an electronic device 800 is assembled from two housings and various cooling attachments from the kit of parts shown in FIG. 3. In another alternate embodiment, the apparatus shown in FIG. 8 can be expanded to cool four processors by using four fans and a single duct entering in the middle of the configuration provided that the duct is large enough to generate enough air flow to adequately cool four processors.

FIG. 9 is a perspective view of an alternate embodiment of an apparatus 900 with two processors in an in-line configuration. The apparatus 900 shown in FIG. 9 comprises an air intake duct 902 coupled to a housing connector 904. The housing connector 904 couples a first housing 906 fitted over a first processor and a second housing 908 fitted over a second processor. A first housing air duct adapter 910 is coupled to the first housing 906. The first housing air duct adapter 910 is coupled to a first air exhaust duct 918. Likewise, the second housing air duct adapter 912 is coupled to a second air exhaust duct 914. The first air exhaust duct 918 and the second air exhaust duct 914 are coupled to a chassis fan adapter 916. The chassis fan adapter 916 allows a system fan (not shown) to be used to exhaust heated air from the first housing 906 and the second housing 908 through the first air exhaust duct 918 and the second air exhaust duct 914 respectively.

FIG. 10 is a perspective view of a dual processor configuration in which each processor housing is coupled to its own air duct for fresh air intake. In the example embodiment shown in FIG. 10, two separate integrated circuit cooling systems are utilized. Each one of the integrated circuit cooling systems comprises a housing, a fan, and an air duct. In one embodiment, each one of the cooling systems are assembled as shown in FIG. 5B.

An apparatus for dissipating heat from an electronic component according to embodiments of the present invention is not limited to the configurations shown above. Alternate embodiments are contemplated having the interchangeable cooling attachments and one or more housings arranged in a multitude of configurations. Such alternate embodiments include any means to generate air flow through a plurality of fins of a heat sink. Such alternate embodiments further include any means to contain and guide air movement through the plurality of fins of a heat sink such that the means substantially eliminates blowby. Such alternate embodiment may also include any means to direct air external to a chassis to the means to contain and guide air movement.

The example embodiments described above are not shown in a system chassis. However, a processor cooling system according to any of the example embodiments described above may be incorporated into a well known computerized system including a chassis, an integrated circuit board mounted in the chassis, and one or more processors coupled to the integrated circuit board.

Furthermore, a system integrator is likely to add a processor cooling system to such a well known computerized system using a kit of parts such as the kit of parts described by reference to FIG. 3. In one embodiment, a system integrator performs a method of assembling a cooling system for an integrated circuit by closely coupling a housing to a heat sink for an integrated circuit and by coupling a fan to the housing. The system integrator may also couple one or more cooling attachments to the housing. One of the advantages of a method of assembling a cooling system using a kit of parts as described herein is that a cooling system can be assembled for use with a variety of industry standard integrated circuit boards from a single kit. The cooling system is assembled by selecting the appropriate cooling attachments based on the space available on the integrated circuit board and the particular thermal situation. The kit also allows the cooling system to be added after the chassis is assembled.

In one embodiment, the operation of such a cooling system provides a method of cooling an integrated circuit by generating a flow of external ambient air through an air duct to a housing closely fitted over a heat sink. The method further includes drawing the flow of external ambient air over the heat sink.

The example embodiments described above provide a scalable, cost effective, highly efficient, universally applied thermal solution for high heat generating electronic components. In one embodiment, a processor heat sink housing attaches over a heat sink and attaches to a processor socket. Various cooling attachments can be attached to this processor heat sink housing to provide a multitude of flow enhancers. These components also provide commonly available mechanical features that lock the assembly in place. The cooling attachments are designed to provide a thermal engineer with several options for cooling an electronic component. Example embodiments utilizing a "Lego" type set of components that can be placed in multiple configurations provide unique thermal solutions.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An apparatus for dissipating heat from an electronic device, the apparatus comprising:
   a housing to be closely fitted to a heat sink, the housing having a first end and a second end;
   an air moving device to move air through the housing; and
   an interchangeable cooling attachment to couple the air moving device to the first end or the second end of the housing and to position the air moving device at a distance from the housing that is about equal to or less than a diameter of the air moving device.

2. The apparatus of claim 1 further comprising an air duct coupled to the first end or the second end of the housing, the air duct to direct the flow of air from an exterior of a chassis to the housing.

3. The apparatus of claim 2 wherein the air duct is a flexible hose.

4. The apparatus of claim 3 wherein the air duct is an extendable hose.

5. The apparatus of claim 2 wherein the air duct is rigid.

6. The apparatus of claim 1 wherein the air moving device is a fan.

7. The apparatus of claim 6 wherein the fan has a diameter of between about 20 millimeters and about 120 millimeters.

8. The apparatus of claim 6 wherein the fan has a diameter of about 60 millimeters.

9. A computerized system comprising:
   a chassis;
   an integrated circuit board mounted in the chassis;
   a processor coupled to the integrated circuit board; and a processor cooling system coupled to the processor, the processor cooling system comprising:
  a heat sink coupled to the processor;
  a housing coupled to the heat sink, the housing positioned in close proximity to the heat sink;
  a fan holder coupled to the housing; and
  a fan interchangeably coupled to the fan holder, the fan to create a flow of air through the housing and the fan positioned at a distance from the housing that is about equal to or less than a diameter of the fan.

10. The computerized system of claim 9 further comprising a first air duct coupled to the housing and to the chassis, the air duct to channel external ambient air to the heat sink.

11. The computerized system of claim of claim 10 further comprising a second air duct coupled to the housing and to the chassis, the second air duct to channel heated air away from the heat sink and out of the chassis.

12. A computerized system comprising:
  a chassis;
  an integrated circuit board mounted in the chassis;
  a processor coupled to the integrated circuit board; and
  a processor cooling system coupled to the processor, the processor cooling system comprising:
    a heat sink coupled to the processor;
    a housing coupled to the heat sink, the housing positioned in close proximity to the heat sink;
    a fan interchangeably coupled to the housing, the fan to create a flow of air through the housing;
    a second fan coupled to the housing; and
    an air duct coupled to the housing.

13. A computerized system comprising:
  a chassis;
  an integrated circuit board mounted in the chassis;
  a processor coupled to the integrated circuit board; and
  a processor cooling system coupled to the processor, the processor cooling system comprising:
    a heat sink coupled to the processor;
    a housing coupled to the heat sink, the housing positioned in close proximity to the heat sink;
    a fan interchangeably coupled to the housing, the fan to create a flow of air through the housing;
    a second processor coupled to the integrated circuit board;
    a second heat sink coupled to the second processor;
    a second housing coupled to the second heat sink, the second housing positioned in close proximity to the second heat sink;
    a second fan coupled to the second housing; and
    a housing connector coupled to the first housing and the second housing.

14. A method of assembling a cooling system for an integrated circuit, the method comprising:
  closely coupling a housing to a heat sink for an integrated circuit; and
  interchangeably coupling a fan housing adapter to the housing
  interchangeably coupling a fan to the fan housing adapter at a distance from the heat sink that is about equal to or less than a diameter of the fan.

15. The method of claim 14 further comprising coupling one or more cooling attachments to the housing.

16. The method of claim 15 wherein coupling one or more cooling attachments to the housing comprises coupling an air duct to the housing and to a chassis.

17. The method of claim 16 further comprising coupling a cooling attachment to the fan.

18. The method of claim 17 wherein coupling a cooling attachment to the fan further comprises coupling an extendable, flexible hose to the fan and to the chassis.

19. A kit of parts for an electronic component cooling system, the kit comprising:
  one or more heat sink housings to fit over a heat sink for an electronic component;
  one or more fan holders to hold a fan at a distance from the heat sink that is about equal to or less than a diameter of the fan; and
  a plurality of interchangeable cooling attachments adapted to be combined with the one or more heat sink housings and the one or more fan holders to form an electronic component cooling system.

20. The kit of parts as claimed in claim 19 further comprising a fan adapted to be coupled to the one or more heat sink housings.

21. The kit of parts as claimed in claim 19 wherein the plurality of cooling attachments are selected from the group consisting of: a housing air duct adapter, an air inlet chassis adapter, a housing fan adapter, a housing connector, a chassis fan adapter, and a splitter.

* * * * *